United States Patent [19]

Robello et al.

[11] Patent Number: 5,723,264
[45] Date of Patent: Mar. 3, 1998

[54] PATTERN TRANSFER TECHNIQUES FOR FABRICATION OF LENSLET ARRAYS USING SPECIALIZED POLYESTERS

[75] Inventors: Douglas R. Robello; Joseph F. Revelli; Jeffrey L. Hirsh, all of Rochester, N.Y.

[73] Assignee: Eastman Kodak Company, Rochester, N.Y.

[21] Appl. No.: 615,938

[22] Filed: Mar. 14, 1996

[51] Int. Cl.$^6$ .................................................. G03F 7/40
[52] U.S. Cl. .............................................. 430/321; 216/26
[58] Field of Search ........................... 430/321; 216/26; 359/619, 620, 642; 257/432

[56] References Cited

U.S. PATENT DOCUMENTS

| | | | |
|---|---|---|---|
| 4,689,291 | 8/1987 | Popovic et al. | 430/321 |
| 5,605,783 | 2/1997 | Revelli et al. | 430/321 |

FOREIGN PATENT DOCUMENTS

| | | |
|---|---|---|
| 3-021901 | 1/1991 | Japan . |
| 3-297167 | 12/1991 | Japan . |
| 4-226073 | 8/1992 | Japan . |

OTHER PUBLICATIONS

Y. Ishihara et al, "A High Photosensitivity IL–CCD Image Sensor with Monolithic Resin Lens Array," International Electron Devices Meeting, 1983, pp. 497–500.

*Primary Examiner*—John A. McPherson
*Attorney, Agent, or Firm*—Raymond L. Owens

[57] ABSTRACT

In a method for forming lenslets which collect light and focus it onto photosensitive elements of an electronic imager includes providing a transparent lenslet-forming layer on a substrate or on layers on the substrate, (a) providing a transparent polyester lenslet-forming layer on a substrate or on layer(s) on the substrate, the polyester containing repeat units, in part, having the structure

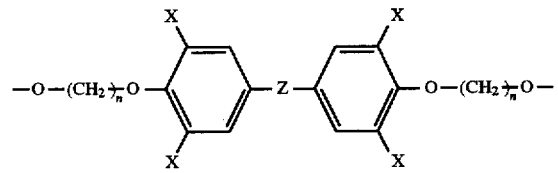

wherein:

n is 2 or greater;

x is selected from the group consisting of H, $CH_3$, Br and Cl; and

Z is selected from the group consisting of nil, O, S, $CH_2$, C=O, SO, $SO_2$, CH—$CH_3$, $CH_3$—C—$CH_3$, $CF_3$—C—$CF_3$, $CH_3$—C—$CH_2CH_3$,

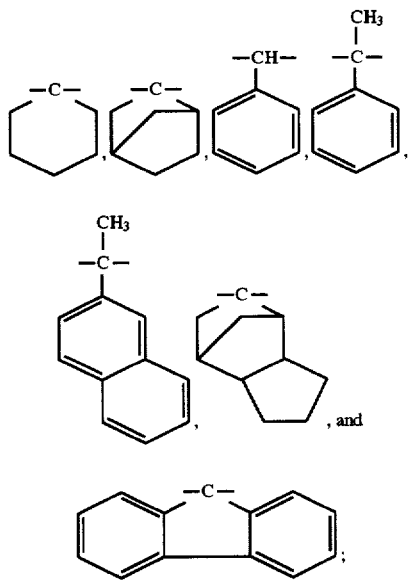

(b) forming a thin etch-stop layer on the transparent lenslet-forming layer and patterning the etch-stop layer to form a mask so that the pattern corresponds to lenslets to be formed;

(c) anisotropically plasma etching the transparent lenslet-forming layer according to the pattern;

(d) removing the thin etch-stop mask; and (e) thermally reflowing the patterned transparent layer to form the transparent lenslets.

7 Claims, 5 Drawing Sheets

PATTERN TRANSFER TECHNIQUES FOR FABRICATION OF LENSLET ARRAYS USING SPECIALIZED POLYESTERS

CROSS REFERENCE TO RELATED APPLICATIONS

Reference is made to commonly assigned U.S. Ser. No. 08/369,235 filed Jan. 6, 1995 to Joseph F. Revelli et al., the teachings of which are incorporated herein.

FIELD OF THE INVENTION

The present invention relates to specialized polyesters which can be used in forming lenslet arrays for solid state image sensors.

BACKGROUND OF THE INVENTION

Solid state imagers consist of two principal parts; an image-forming part (i.e., a lens) and an image-capture part (i.e., an electronic image sensor device). The image is projected by the lens onto the surface of the electronic image sensor device at which surface the image is divided uniformly into many small picture elements or "pixels". These pixels are quite small and typically range in size from less than ten microns to over 100 microns across. The electronic image sensor itself is typically a silicon chip upon which an array of photodiodes has been fabricated such that each pixel is associated with a single photodiode element.

A subset of electronic sensors is known as "interline" devices. In these devices, the area of the photodiode is significantly less than that of the pixel. A lightshield is placed over the pixel area except in the photodiode region to prevent light from entering other light-sensitive device elements such as the transfer gate or the shift register which are within the pixel area but outside the photodiode. Consequently any light that falls on a particular pixel outside the photodetector area can not be captured unless some sort of optical condensing element such as a lenslet is positioned between the light source and the photodetector. The desired characteristics of the lenslet array are 1) the lenslets must be properly aligned with respect to the photodiode array, 2) the lenslets must be properly spaced from the photodiode, or, alternatively, the index of refraction and the radius of curvature must be such that the resulting focal length of the lenslet is approximately equal to the distance between the lenslets and the photodiodes, 3) the lenslets must be optically transparent and remain so in ambient conditions, 4) the lenslets must be as closely spaced as possible to minimize non-captured light, and 5) the lenslets must be as uniform as possible.

Integrated microlens structures and fabrication processes were disclosed by Y. Ishihara et al., "A High Photosensitivity IL-CCD Image Sensor with Monolithic Resin Lens Array," International Electron Devices Meeting, 1983, pp. 497–500, for cylindrical lenslet arrays and Popovic et al., U.S. Pat. No. 4,689,291, for spherical lenslet arrays. Aspects of both of these methods are summarized in FIG. 1. According to FIG. 3A, a thick layer of photosensitive resin is deposited on an organic planarization/spacer layer 14 and then photolithographically patterned into stripe-like (former case) or cylinder-like lenslet precursor structures 12 (latter case). The organic planarization/spacer layer 14 itself is deposited directly on the surface of the solid-state image sensor. It will be understood that the planarization/spacer layer 14 could be deposited on top of other layers which have been deposited on the surface of the solid state sensor. These additional layers could include patterned dye color filter arrays (such as might be found in color solid state imaging devices), light shield layers, or other planarization layers. These cylinder-like lenslet precursor structures 12 are then heated sufficiently to cause them to reflow, thereby forming semi-cylinder or semi-spherical lenslets 16 (see FIG. 5b). There are several problems with this way of forming lenslet arrays. First of all, especially for electronic color imagers, typical photosensitive resins contain components which absorb in the blue region of the visible spectrum. This results in a distortion of the color spectrum or "yellowing" of the scene that is "seen" by the photodetector array through an adjacent array of color filters. Moreover, the color distortion increases with time due to oxidation of the resin. A second difficulty with this method of forming lenslet arrays is that the resolution with which the photosensitive resin can be patterned is limited by the thickness of the resin layer. The thicker the resin layer, the farther apart the lenslets in the array and, consequently, the less the light collection efficiency of the array. On the other hand, the resin layer must be thick enough so that, when reflowed, the sag of the resultant lenslets is sufficient to cause the desired focusing effect. Accordingly, it is not possible to obtain the highest possible collection efficiency with lenslet arrays fabricated in this manner.

For medical imaging applications, the sensor must survive sterilization at elevated temperature. The glass transition temperature ($T_g$) of most commercial photoresists is low enough that sterilization can ruin the lenslets. Also, yellowing is particularly noticeable at elevated temperature.

Alternative lenslet fabrication techniques have been proposed which avoid some of the difficulties mentioned above. In these techniques the photolithographic patterning and lens-forming functions are separated. The photosensitive resin serves as both the patterning means and the lens-forming means in the aforementioned technique.

FIG. 4 illustrates an alternative scheme disclosed by Y. Hokari in Japanese Kokai Patent Application No. Hei 4[1992]-226073. In the FIG., a lenslet-forming layer 18 is made of a transparent inorganic material such as $SiO_2$ which is deposited on the surface of an organic planarizing spacer layer 14 which is in turn deposited on the surface of the electronic image sensor chip. A thick photosensitive resin layer is then deposited on lenslet-forming layer 18 and patterned to form lenslet precursors 12 (FIG. 4a). The resin precursors are subsequently transformed into semi-spherical shapes 16 by thermal reflowing (FIG. 4b). As shown in FIG. 4c, inorganic transparent lenslets 20 are then created by transferal of the lens-shaped pattern formed by the reflowed resin to the lenslet-forming layer 18 by reactive ion etching. Next, $SiO_2$ is deposited selectively only on the surfaces of the inorganic transparent lenslets 20 by means of well known "spin on glass" or SOG techniques to form lenslet covering films 22 which is shown in FIG. 4d. In this fashion, the spacing between the lenslets can be effectively reduced to zero thereby increasing the light capturing efficiency of the lenslets. One difficulty with this method is the formation of thick layers (i.e. 10 microns) of inorganic materials such as $SiO_2$ especially on organic bases. Deposition techniques such as RF (radio frequency) sputtering require several hours of deposition time to form such thick layers. During such lengthy deposition times the organic base can become hot enough to decompose. Furthermore thick layers of inorganic materials tend to be mechanically unstable and crack or peel, especially when deposited on organic bases. In addition, films of SOG can require treatment at temperatures as high as 400° C. in order to become fully densified. Clearly the high temperatures associated with thick film inorganic layer deposition are incompatible with both the electronic image sensor substrate and the organic layers. Finally, it is extremely difficult to control the reactive ion etch conditions in order to transfer the lens pattern in the organic resin faithfully to the inorganic layer. Exact etch conditions must be found for which the etch rates of the organic and inorganic materials are identical. Deviations from these conditions or non-uniformity of the etch conditions will result in the formation of unacceptable lenslet arrays. Reactive ion etching can also result in unacceptably rough lenslet surface finishes.

Another alternative scheme for lenslet fabrication is described by H. Kawashima et al. in Japanese Kokai Patent Application No. Hei 3 [1991]-297167. Referring to FIG. 5, a thick (i.e., several microns) transparent inorganic planarization/spacer layer 24 is deposited on the surface of the electronic image sensor chip. A thick (i.e., 2 to 10 micron) organic lenslet-forming layer 26 is then deposited on the planarization/spacer layer 24. This lenslet-forming layer is made of a transparent thermoplastic resin such as PMMA (polymethylmethacrylate), PGMA (polyglycidylmethacrylate), PMIPK (polymethylisopropenylketone), etc. Next a first photosensitive resin layer 28 is deposited on the lenslet-forming layer as shown in FIG. 3A. After photolithographically patterning the first photosensitive resin layer, the pattern is transferred to the lenslet-forming layer by means of oxygen plasma etching (FIG. 5b). The inorganic planarization/spacer layer 24 behaves as an etch-stop for the oxygen plasma etch process. The first photosensitive resin mask 30 is removed with a release solution (ethanol, acetone, etc.) leaving organic lenslet precursor 32 in the thermoplastic resin. The transparent microlens array is then created by thermally reflowing the lenslet precursor structures to form organic lenslet 34 which are shown in FIG. 5c. The disclosure goes on to describe the application and patterning of a second photosensitive resin etch-mask 36 which is shown in FIG. 5d. A wet etch solvent is used to remove unwanted portions of the transparent inorganic planarization/spacer layer 38 and the residual resist is removed with a solvent such as ethanol as shown in FIG. 5e. Patterning of the planarization/spacer layer is necessary in order to provide access to electrical contacts of individual electronic imagers. Several of these imagers are fabricated on a single silicon wafer which is subsequently diced into separate devices. If the planarization/spacer layer is patterned prior to spin-coating the lenslet-forming layer, nonuniform coating of the lenslet-forming layer results. This in turn causes nonuniformity of the lenslet array. The fabrication sequence described in FIG. 5 is designed to avoid this problem.

As mentioned with respect to the previously cited reference of Hokari, the deposition of thick inorganic layers is usually problematical due to the long deposition times or high processing temperatures or both. The Kawashima reference also suffers from the fact that most organic photosensitive resins are not immune to erosion by oxygen plasma etching. This lack of selectivity implies that the resin mask will erode as the thick thermoplastic resin layer is being etched and will result in poorly formed lenslet precursor structures and consequently poorly formed semi-spherical lenslets. Even if the selectivity of the photosensitive resin were to be sufficient to withstand exposure to the lengthy oxygen plasma etch process, the difficulty of removing the residual resist prior to reflowing the thermoplastic resin and after patterning the inorganic planarization/spacer layer is problematical. Solvents that are used to remove the photoresists (i.e., ethanol, acetone) can also dissolve the organic thermoplastic resin.

The following are requirements of an effective lens forming material:

1) the material must be colorless and nonscattering, and retain this transparency over long periods of use. In particular, it must not yellow after prolonged exposure to light and moderately elevated temperatures. Typical photoresist materials are particularly problematic in this area;

2) the dome shape must form by thermal reflowing at temperatures below 180° C. At higher temperatures, the color filter array layer and the electronic elements beneath the microlens are damaged;

3) the microlens must retain its shape and optical quality when exposed to autoclave conditions (135° C. for 24 h). Requirements 2 and 3 imply that the $T_g$ of the lens material must be approximately between 130° and 150° C.;

4) the refractive index of the microlens material must be high to provide a sufficiently short focal length. Ideally, a replacement material should exhibit a refractive index close to the photoresists currently employed for lenslets, where n=1.61. An even higher refractive index material might be useful in certain cases. The material should exhibit low birefringence after thermal reflowing;

5) the microlens material must not be damaged by the solvents used in removing the dicing protection layer (DPL) at the end of the fabrication process;

6) the microlens material must adhere strongly to its substrate;

7) the process for forming the microlens cannot damage any components of the sensor. Device performance must be unaffected; and 8) the microlens-forming process must be manufacturable. Toxic materials and solvents must be avoided. The microlens material should be inexpensive and readily available.

SUMMARY OF THE INVENTION

It is therefore an object of the present invention to provide lenslet arrays for image sensors which eliminate the above noted difficulties and has an improved lenslet forming layer.

This object is achieved by a method for forming lenslets which collect light and focus it onto photosensitive elements of an electronic imager, comprising the steps of:

a) providing a transparent polyester lenslet-forming layer on a substrate or on layer(s) on the substrate, the polyester containing repeat units, in part, having the structure

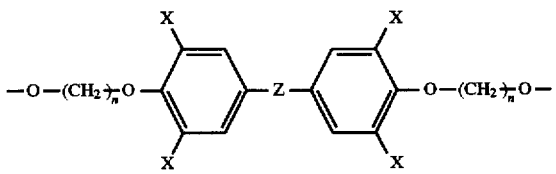

wherein:

n is 2 or greater;

X is selected from the group consisting of H, $CH_3$, Br and Cl; and

Z is selected from the group consisting of nil, O, S, $CH_2$, C=O, SO, $SO_2$, CH—$CH_3$, $CH_3$—C—$CH_3$, $CF_3$—C—$CF_3$, $CH_3$—C—$CH_2CH_3$,

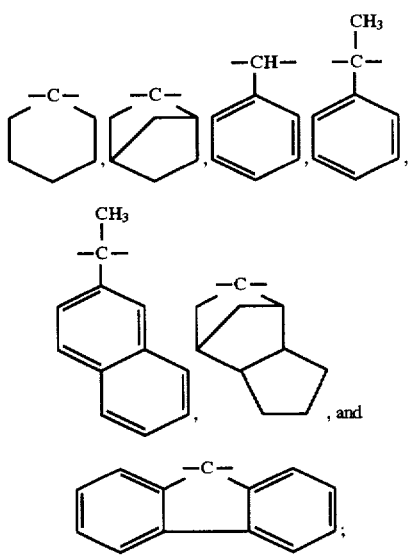

(b) forming a thin etch-stop layer on the transparent lenslet-forming layer and patterning the etch-stop layer to form a mask so that the pattern corresponds to lenslets to be formed;

(c) anisotropically plasma etching the transparent lenslet-forming layer according to the pattern;

(d) removing the thin etch-stop mask; and (e) thermally reflowing the patterned transparent layer to form the transparent lenslets.

Advantageous Effect of the Invention

In accordance with the present invention, an improved polyester material has been discovered which provides the following advantages:

1) poly(ether ester) of this type are convenient to manufacture by melt polyesterification. The process inexpensive and produces little waste;

2) a large variety of aromatic diesters ($CH_3O_2C$—Ar—$CO_2CH_3$) are available as starting materials. The required aromatic glycols (HO—$CH_2CH_2$—O—Ar'—O—$CH_2CH_2$—OH) are either commercially available or easily synthesized from commercial bisphenols (HO—Ar'—OH) using simple reactions. Scale up to many kilograms is straightforward. These ingredients can be selected to provide the required high $T_g$ and refractive index;

3) the composition of copolymers can be used to precisely tune the physical properties of the material. Ethylene glycol is necessary, at least in small amounts, for synthetic reasons. Then, for example, the ratio of aromatic glycol to ethylene glycol can be varied: less ethylene glycol in the formulation will raise both the $T_g$ and the refractive index;

4) these slightly polar polymers are expected to have poor solubility in solvents used to remove the DPL;

5) the photochemical stability of these polyesters should be excellent; and 6) compared to existing materials, the lenses described herein are more resistant to yellowing over time, and can withstand autoclaving. Imaging sensors using these materials provide competitive advantages, especially in the medical imaging applications.

DETAILED DESCRIPTION OF THE INVENTION

In the present invention, use is made of the so-called "trilayer" processing technique to avoid many of the difficulties associated with prior art. Trilayer reactive ion etching-portable conformable mask (RIE-PCM) systems have been known for some time in the IC industry as a means of forming structures with high aspect ratios in organic planarizing layers. J. M. Moran and D. J. Maydan (Journal of Vacuum Science Technology, 1979, 16, pp 1620–1624) were the first to demonstrate the versatility and process compatibility of trilayer $SiO_2$ RIE-PCM. The critical processing steps of the trilayer RIE-PCM system include spin-coating a thick organic planarization/spacer layer, plasma CVD (chemical vapor deposition) or RF sputter-coating a thin layer of inorganic material such as $SiO_2$ (typically a few hundred Å in thickness), spin-coating the photosensitive resin layer, exposing through the appropriate mask, developing the pattern, etching the exposed inorganic material, and transferring the pattern to the organic layer by means of oxygen plasma RIE. The advantage of this process is that only a thin layer of photosensitive resin is required to pattern the thin inorganic layer. The thin inorganic layer in turn acts as an etch-stop or etch-mask for the oxygen plasma RIE and the anisotropic nature of the etch results in near vertical walls in the thick organic planarization/spacer layer.

Figure 6:
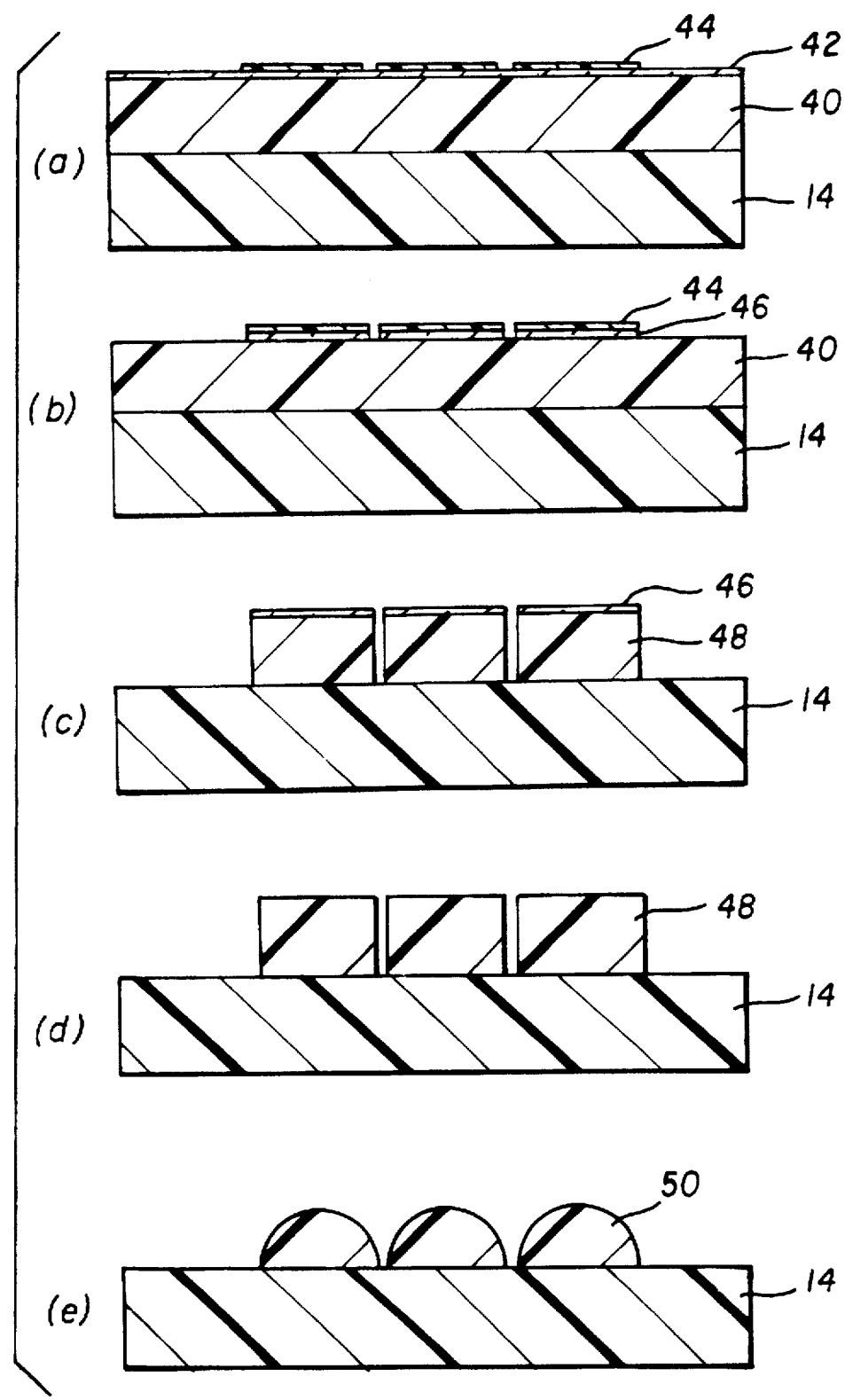
FIG. 6 shows a series of steps (A–E) for forming lenlets in accordance with the present invention.

The key aspects of the present invention are illustrated with the help of FIG. 6. An organic planarization/spacer layer 14 is spin-coated on the silicon chip followed by a transparent polyester lenslet-forming layer 40. As mentioned previously, it is understood that planarization/spacer layer 14 could be deposited on layer(s) that have been formed on the silicon chip substrate. The polyester lenslet-forming layer 40 contains repeat units, in part, having the structure:

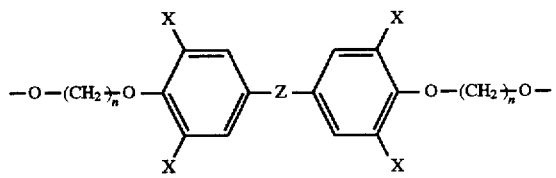

wherein:

n is 2 or greater;

X is selected from the group consisting of H, $CH_3$, Br and Cl; and

Z is selected from the group consisting of nil, O, S, CH2, C=O, SO, $SO_2$, CH—$CH_3$, $CH_3$—C—$CH_3$, $CF_3$—C—$CF_3$, $CH_3$—C—$CH_2CH_3$.

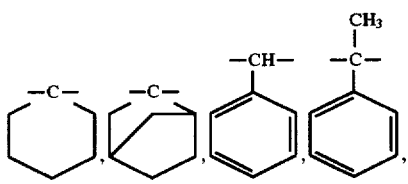

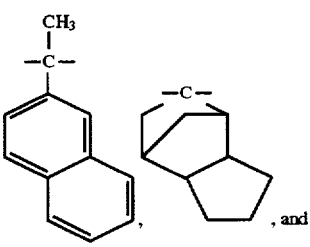

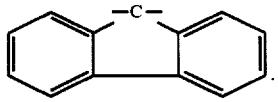

The structures, compositions, and physical properties of polymers that fit the above description are given in Table 1. Preferred formulations possess glass transition temperatures near 140° C. and refractive indices near 1.61. Also, solubility of the polymers in solvents commonly used for spin-casting was best when the aromatic glycol contained a large side group.

TABLE 1

Synthesis of Poly(ether ester)s

| Example | Structure[a] | $T_g$[b] | n[c] |
|---|---|---|---|
| 3 | [structure with 0.75 and 0.25 subunits] | 141° C. | 1.625 |
| 4 | [structure with 0.6 and 0.4 subunits] | 134° C. | 1.62 |

TABLE 1-continued

Synthesis of Poly(ether ester)s

| Example | Structure[a] | $T_g$[b] | n[c] |
|---|---|---|---|
| 5 | (structure image) | — | — |
| 6 | (structure image) | 138° C. | ND[d] |
| 7 | (structure image) | 120° C. | ND[d] |
| 8 | (structure image) | — | — |

TABLE 1-continued
Synthesis of Poly(ether ester)s
| Example | Structure[a] | $T_g$[b] | n[c] |
|---|---|---|---|
| 9 | 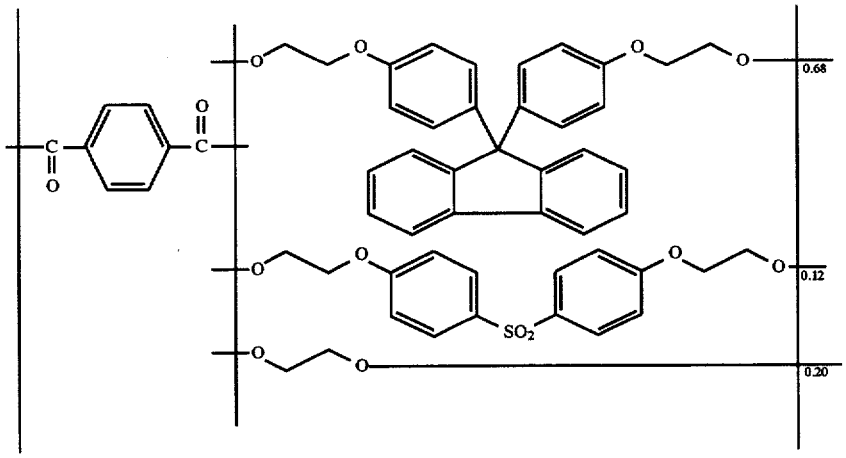 | 127° C. | 1.62 |
| 10 | 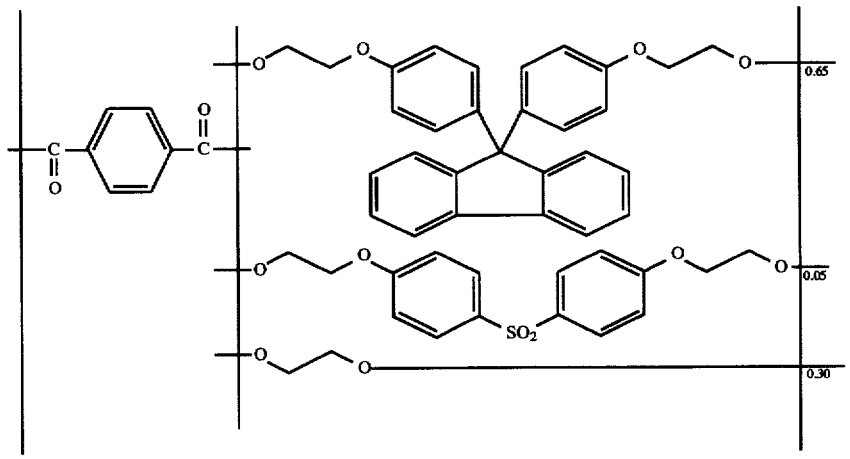 | 148° C. | ND[d] |
| 11 | 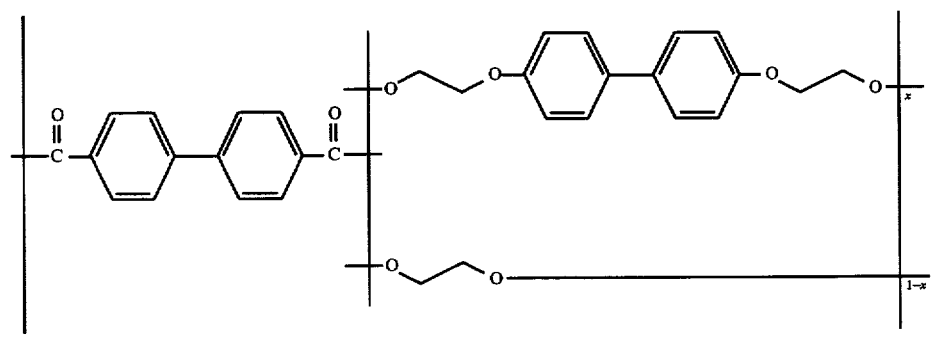 | — | — |

TABLE 1-continued

Synthesis of Poly(ether ester)s

| Example | Structure[a] | $T_g$[b] | n[c] |
|---|---|---|---|
| 12 | (structure) | 134° C. | 1.63 |
| 13 | (structure) | 138° C. | ND[d] |
| 14 | (structure) | — | — |

TABLE 1-continued

Synthesis of Poly(ether ester)s

| Example | Structure[a] | $T_g$[b] | n[c] |
|---|---|---|---|
| 15 | | 141° C. | 1.63 |
| 16 | | ND[d] | ND[d] |
| 17 | | — | — |

TABLE 1-continued

Synthesis of Poly(ether ester)s

| Example | Structure[a] | $T_g$[b] | n[c] |
|---|---|---|---|
| 18 | | 126° C. | 1.58 |
| 19 | | 107° C. | 1.62 |
| 20 | | — | — |

TABLE 1-continued

Synthesis of Poly(ether ester)s

| Example | Structure[a] | $T_g$[b] | n[c] |
|---|---|---|---|
| 21 | (structure) | 120° C. | 1.62 |
| 22 | (structure) | 108° C. | ND[d] |
| 23 | (structure) | — | — |

TABLE 1-continued

Synthesis of Poly(ether ester)s

| Example | Structure[a] | $T_g{}^b$ | $n^c$ |
|---|---|---|---|
| 24 | [Poly(ether ester) with terephthaloyl unit, and tetrabromobisphenol-A bis(2-hydroxyethyl ether) diol (0.6) and ethylene glycol (0.4) comonomers] | 98° C. | 1.61 |

[a]Numbers within structures represent composition (by moles) of monomer feed. [b]Glass transition temperature by DSC (midpoint). [c]Refractive index at 632.8 nm by analysis of waveguide modes. [d]Not determined.

Polymers 9,9-bis(4-(2-hydroxyethoxyphenyl)-fluorene possessed superior physical properties for the proposed application. Structurally, this monomer provides several benefits:

1) its rigidity leads to higher glass transition temperatures than can be achieved using acyclic bridging groups;

2) the bulky fluorenyl residue is situated perpendicular to and extending from the backbone of the polymer, thereby inhibiting crystallization in the polymer and improving solubility compared to simpler derivatives;

3) its conjugated aromatic structure provides relatively high refractive index;

4) there are large components of the refractive index both parallel and perpendicular to the polymer chain, contributing to decreased stress birefringence; and 5) the repeat unit is extremely stable, both thermally and photochemically.

Other monomers can be incorporated for different reasons. For example, 4,4'-bis(2-hydroxyethoxy)benzophenone or 4,4'-bis(2-hydroxyethoxy)diphenylsulfone can be included in the polymerization reaction to improve the solvent resistance of the eventual lenslets.

Following the deposition of the transparent lenslet-forming layer 40 is the deposition of a thin layer 42 of inorganic material such as $SiO_2$. This layer needs to be only 100 to 500 Å in thickness and can be deposited by one of several means including RF-sputtering, plasma CVD, thermal evaporation, or SOG. It will be appreciated that this thin inorganic layer serves as a temporary etch-stop and need not necessarily be restricted to $SiO_2$. Other candidate inorganic etch-stop materials include but are not restricted to $Si_3N_4$, silicon, germanium, amorphous carbon, titanium, or organometallic glasses and polymers. Following the etch-stop layer, a thin layer of photosensitive resin is spin-coated on the laminate structure. It will be further appreciated that this photosensitve layer need not be very thick: a photosensitve resin layer as thin as one or two thousand Å would be sufficient. This is possible because the photoresist is used merely to pattern the etch-stop layer and is not used to form the lenslet itself. As shown in FIG. 6a, the photosensitive resin is exposed with a suitable mask and developed. The thin photosensitive resin mask pattern 44 is subsequently transferred to the thin etch-stop layer 42 by either wet- or dry-etch techniques to form the thin etch-stop mask 46 (FIG. 6b) and transferred once again by means of oxygen plasma etching to the transparent organic lenslet-forming layer (FIG. 6c). The thin inorganic etch-stop mask 46 serves as a highly selective etch-stop and protects the organic material below from etching by the oxygen plasma. It will be still further appreciated that due to the high degree of anisotropy of the oxygen plasma RIE and the high selectivity of the inorganic etch-stop, the etched walls of the lenslet-forming layer will be nearly vertical giving rise to well-defined lenslet footprints and permitting smaller separations between the individual lenslets. This results in greater effective light collection area or, alternatively speaking, greater collection efficiency for each lenslet. The etch process is terminated after a prescribed time interval chosen such that the interval is adequate for the transparent lenslet-forming layer to be completely removed in those areas unprotected by the inorganic etch-stop mask. It will be still further appreciated that the duration of the oxygen plasma etch is not critical: it is unimportant if the planarization/spacer layer 14 is partially etched in the regions between the lenslets since none of the light incident upon these areas will be collected anyway. After removal of the patterned thin inorganic etch-stop mask by means of standard wet or dry etch techniques, polyester transparent lenlets precursor 48 of the lenslet-forming material are left as shown in FIG. 6d. The shapes of these structures are changed to approximately polyester transparent lenslet 50 by thermally reflowing the organic transparent lenslet-forming material (FIG. 6e).

As mentioned previously, it is usually necessary to pattern the organic planarization/spacer layer to allow for electrical interconnects to the individual imagers. One possibility is to pattern the organic planarization/spacer layer prior to the lenslet fabrication sequence depicted in FIG. 6. However, this procedure is undesirable since it can result in nonuniform lenslet sag as mentioned earlier in connection with the previously-cited reference of Kawashima. Another possibility would be to employ the method proposed in the same Kawashima reference; namely, spin-coat a second photoresist layer on top of the completed lenslet array, expose the resist with the appropriate pattern, etch the planarization/ space layer, and finally remove the resist with a suitable solvent. Unfortunately, this is not a desirable method either since the application and removal of the resist are likely to cause dissolution of the completed organic lenslets.

Figure 5:
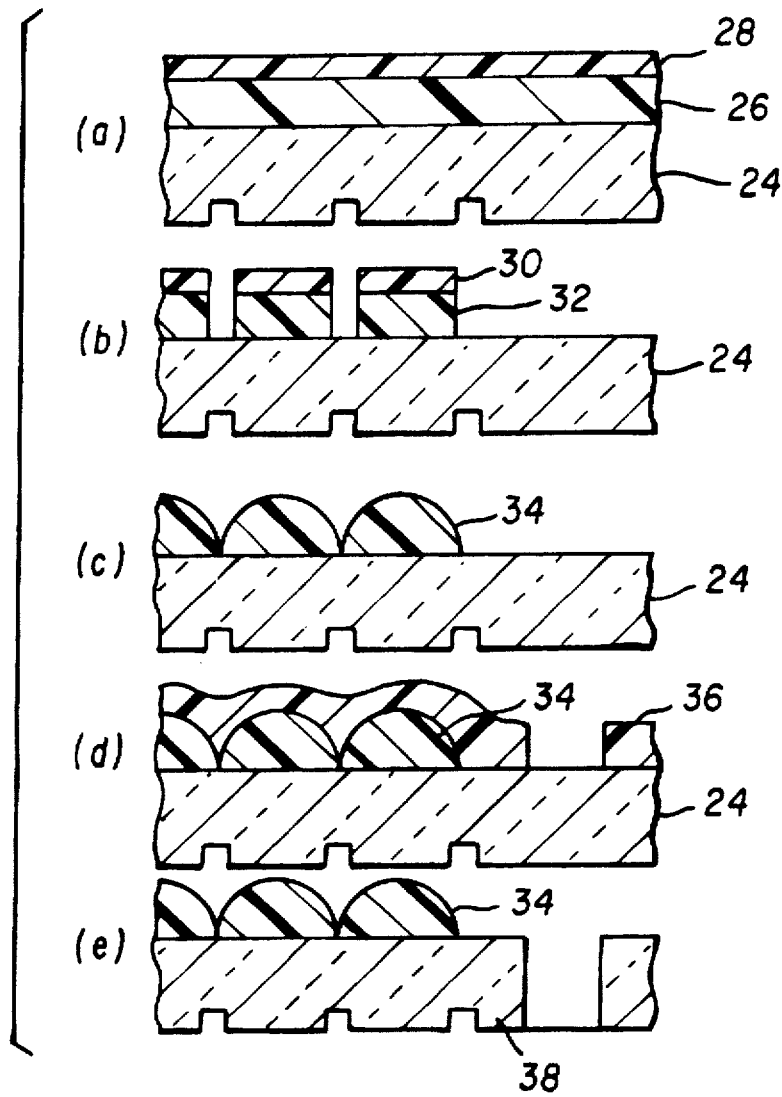
FIG. 5 shows a series of steps (A–E) in yet another prior method for forming lenslets.

FIG. 5 illustrates a second embodiment of the present invention which avoids these difficulties by using a second inorganic etch-stop layer to pattern the planarization/spacer layer after the lenslet-forming layer has been spin-coated. With reference to FIG. 5A an organic planarization/spacer layer 14 is spin-coated on the device substrate or on layer(s) on the device substrate. Next a first thin inorganic etch-stop layer 52 is deposited on the planarization/spacer layer followed by a first thin photosensitive resin layer. The first thin photosensitive resin layer is photolithographically patterned according to a photomask which defines the lateral boundaries of the planarization/spacer pads (FIG. 7a). The pattern of the resulting first thin photosensitive resin mask 54 is then transferred to the first thin etch-stop layer 52 by means of wet or dry etch techniques is described previously to form etch-stop mask 56 followed by the removal of the first photoresist mask (FIG. 7b). Polyester transparent lenslet-forming layer 58 is then spin-coated on first etch-stop mask 56 and a second thin inorganic etch-stop layer 60 is deposited on this lenslet-forming layer. Finally, a second thin resist layer 62 is spin-coated and photolithographically delineated with a pattern corresponding to the footprints of the individual lenslets. The second thin resist mask 62 is positioned such that it is precisely aligned with respect to the underlying first etch-stop mask 56 (FIG. 7c). Resist pattern 62 is transferred to second etch-stop layer 60 by means of wet or dry etch techniques as described previously to form second thin etch-stop mask 64 as shown in FIG. 7d. This pattern in turn is transferred to the lenslet-forming layer by means of oxygen plasma RIE. The duration of the plasma etch is such that polyester transparent lenslet precursor 66 are formed at the same time that the planarization/spacer pad 68 is formed (FIG. 7e). It will be appreciated that patterned layer 56 serves as an etch-stop to prevent erosion of the organic planarization/spacer pad in the regions between the cylinder-like lenslet precursor structures and at the same time serves as a mask to define the lateral limits of the planarization/spacer pad. A wet or dry etch process is used to remove the exposed inorganic etch-stop as shown in FIG. 7f and finally the lenslet precursor structures are thermally reflowed to form the polyester transparent lenslet 72 shown in FIG. 7g. The $T_g$ of the organic planarization/spacer pad 68 is chosen so that it is higher than that of the lenslet-forming material. In this way, planarization/spacer pad 68 retains its shape during heating and reflowing of the lenslet precursor structures. As mentioned previously, the thickness uniformity of the polyester transparent lenslet-forming layer 58 is maintained since the planarization/spacer layer is patterned subsequent to the depositon of this layer. Furthermore the thickness uniformity of the planarization/spacer pad 68 is maintained due to the presence of the etch-stop mask 56. Finally, the patterned etch-stop mask 70 serves the additional function of confining the lateral flow of the lenslet precursor when it is heated to form the polyester transparent lenslet 72.

It will be appreciatedby those skilled in the art that the trilayer RIE-PCM processing procedures outlined above in both embodiments of the invention could be replaced by trilayer Deep-UV PCM procedures. In this case, the inorganic thin film etch-stop layer would be replacedby a thin film of a material that is deep-UV blocking such as germanium-selenium or silicon. Furthermore the lenslet-forming layer would have to be deep-UV sensitive.

It will be further appreciated that the photosensitive resin layer and the etch-stop layer in both embodiments of the present invention could be replaced by a single photosensitive resin layer containing metallic elements such as silicon or tin. In the first embodiment, the process step illustrated in FIG. 6a could be eliminated entirely. Thin photosensitive resin mask 44 and thin inorganic etch-stop mask 46 in FIG. 6b would be replaced with a single thin (i.e. 2000 to 6000 Å thick) photosensitive resin layer containing metallic elements. Likewise the process step(s) illustrated in FIG. 7c and/or FIG. 7a could be eliminated in the second embodiment of the present invention. Photosensitive materials containing metallic elements can be spin-coated, exposed, and developed in the usual manner. When exposed to oxygen RIE, these materials are partially converted to refractory metal oxides that can serve as an etch-stop material in place of the thin layer of $SiO_2$ or other inorganic material previously described. For example, any of the metal-containing photoresist materials reviewed by T. Iwayanagi, et al. (from "Electronic and Photonic Properties of Polymers," M. J. Bowden and S. R. Turner, eds., American Chemical Society: Washington D.C., 1988, pp 158–166) might be employed. This alternate practice-has the advantage of combining the functions of the photosensitive resin and the etch-stop layers, thereby providing a simpler process. On the other hand, it exhibits a disadvantage in that the complex metallic oxide/organo-metallic polymer remaining after oxygen RIE is difficult to strip away. This material can only be removed by freon RIE followed by oxygen RIE or alternatively by RIE using a gas containing a mixture of both oxygen and freon. A second disadvantage is that the resolution obtainable with the alternative process is not as high as that of the trilayer process previously described. Finally, in the case of the second embodiment of the invention, a third disadvantage is that the portion of the patterned first thin etch-stop mask (corresponding to 70 in FIG. 7f) directly beneath the polyester transparent lenslet precursors (66 in FIG. 7f) can not be removed. This could result in unwanted absorption due to the "yellowing" phenomenon mentioned previously.

EXAMPLE 1

Synthesis of 4,4'-bis(2-hydroxyethoxy) benzophenone 4,4'-Dihydroxybenzophenone (50.0 g, 0.233 mol) was dissolved in a solution of 28 g (0.70 mol) of sodium hydroxide in 200 mL of water. The solution was stirred mechanically and warmed to approximately 60° C. 2-Chloroethanol (41.3 g, 0.513 mol) was added slowly over 30 min. After 3 h, an additional 10 g (0.12 mol) of 2-chloroethanol was added, and the reaction was continued for 4 h. The mixture was cooled to 23° C., and the precipitated product was filtered and washed with water, and dried. After recrystallization from ethanol/THF, 53.2 g (75%) of a white solid was obtained.

$^1$H NMR (300 MHz, DMSO-$d_6$) δ 3.7 (m, 4H), 4.08 (t, J=4.8, 4H), 4.91 (t, J=5.5, 2H), 7.06 (d, J=8.7, 4H), 7.66 (d, J=8.6, 4H).

EXAMPLE 2

Synthesis of 9,9-bis(4-(2-hydroxyethoxyphenyl) fluorene

A mixture of 84.4 g (0.241 mol) of 9,9-bis(4-hydroxyphenyl)fluorene, 46.7 g (0.53 mol) of ethylene carbonate, 3.3 g (0.024 mol) of potassium carbonate, and a catalytic amount of 18-crown-6 in 400 mL of xylenes was heated at reflux with mechanical stirring for 6 h. The mixture was allowed to cool slowly to room temperature, and the solvent was decanted from the precipitated product. The resulting white solid was washed with ligroin (to prevent the formation of a gummy mass), and dried under a stream of nitrogen. The product was recrystallized from methanol, providing 70.4 g (67%) of a white powder.

$^1$H NMR (300 MHz, CDCl$_3$) δ 2.0 (s, 2H), 3.9 (br s, 4H), 4.02 (t, J=4.3, 4H), 6.76 (d, J=8.8, 4H), 7.12 (d, J=8.7, 4H), 7.25 (m, 2H), 7.37 (m, 4H), 7.75 (d, J=7.4, 2H). FD-MS m/e 438 (M$^+$).

EXAMPLE 3

Figure 7:
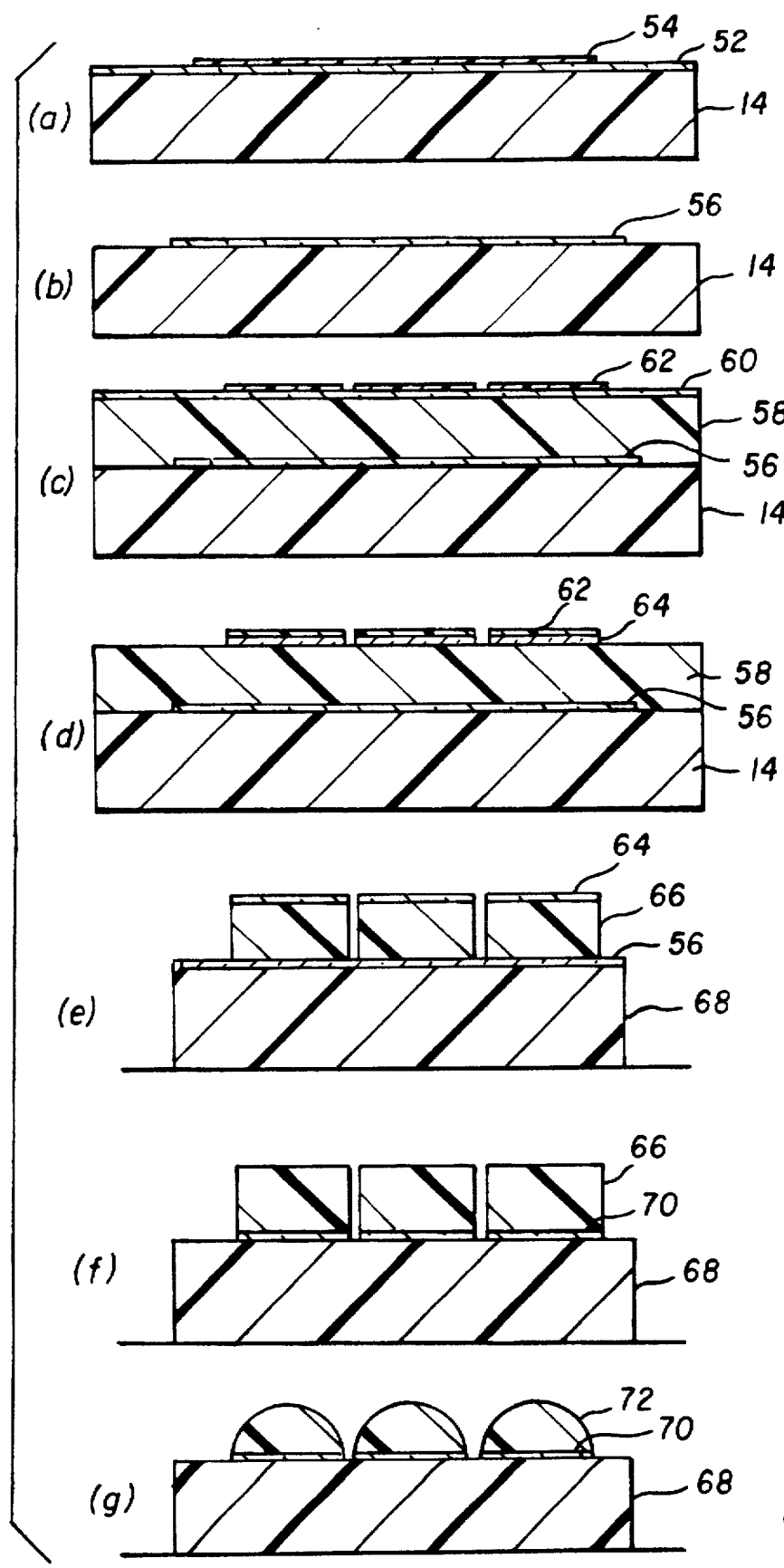
FIG. 7 shows a series of steps (A–G) for forming lenlets in accordance with another embodiment of the present invention.

A mixture of 27.7 g (0.143 mol) of dimethyl terephthalate, 46.9 g (0.107 mol) of 9,9-bis(4-(2-hydroxyethoxyphenyl) fluorene, 4.5 g (0.072 mol) of ethylene glycol, 336 mg of zinc acetate dihydrate, and 190 mg of antimony trioxide was at 200° C. under nitrogen. Nitrogen was bubbled slowly through the melt while the following temperature program was carried out: 1 h at 200° C., 1 h at 220° C., and 2h at 240° C. The nitrogen inlet was replacedby a mechanical stirrer, and the melt was stirred under vacuum. (ca. $10^{-2}$ torr) for 3 h. After cooling to room temperature, the flask was broken open, and the contents were dissolved in approximately 700 mL of warm dichloromethane. The solution was filtered through a pad of Celite to remove catalyst residue and bits of glass, and the polymer was precipitated into excess methanol in a blender. The product was filtered and dried in a vacuum oven for 2 d at 80° C. Yield: 64.1 g (95%) of white powdery polymer. The improvement in visible light transparency provided by this invention is clearly demonstrated by comparison of FIG. 6 (prior art) with FIG. 7 (this material). The FIGS. show the % transmittance versus wavelength for freshly prepared and for aged lenslet materials. The prior art material displays unacceptable absorbance at shorter wavelengths that gets progressively worse when the material is aged for 45 d at 85° C. (FIG. 6). The material of this example shows no unwanted absorption both initially and after being aged at 85° C. for 90 d (FIG. 7).

Figure 1:
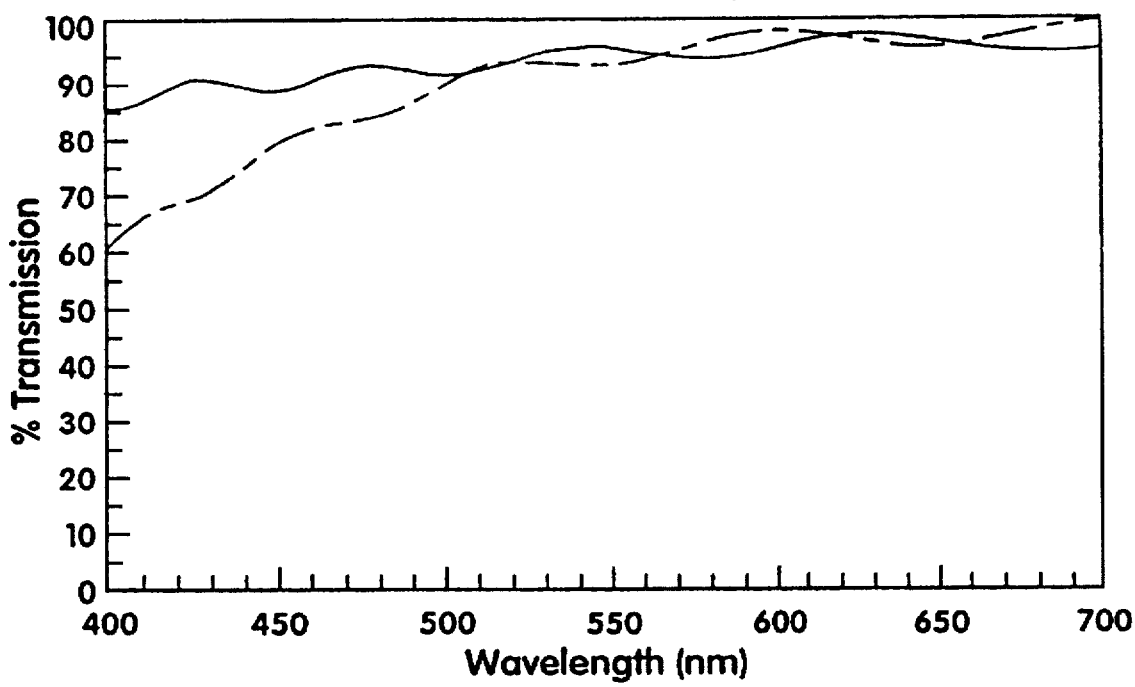
FIG. 1 shows the absorption spectrum of prior art material for lenslets as it is initially deposited and then after aging.
Figure 2:
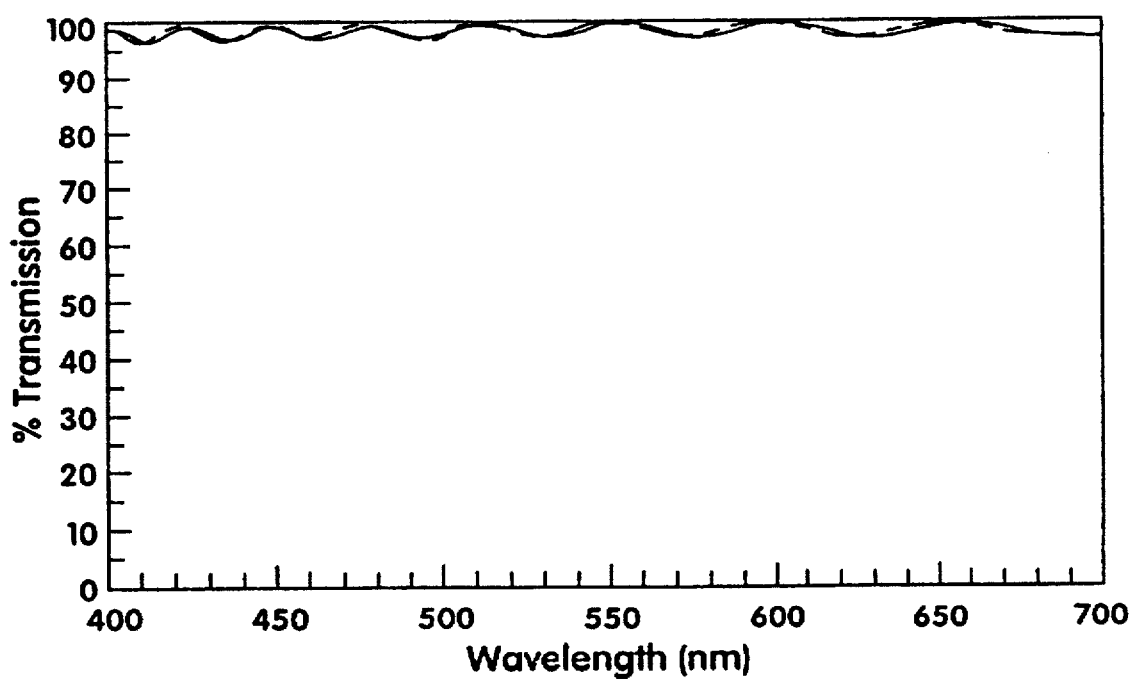
FIG. 2 shows the absorption spectrum of material in accordance with the invention for lenslets as it is initially deposited and then after aging.
Figure 3A:
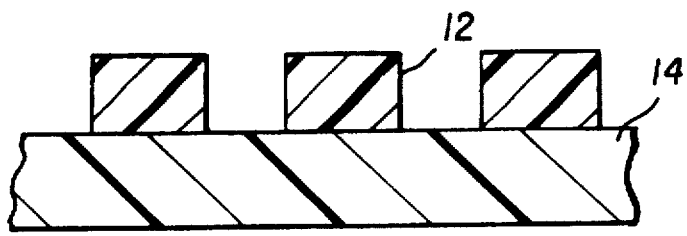
FIGS. 3A and 3B show various steps in a conventional process for forming lenslets.
Figure 3B:
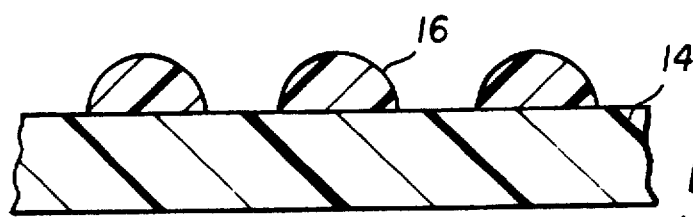
Figure 4:
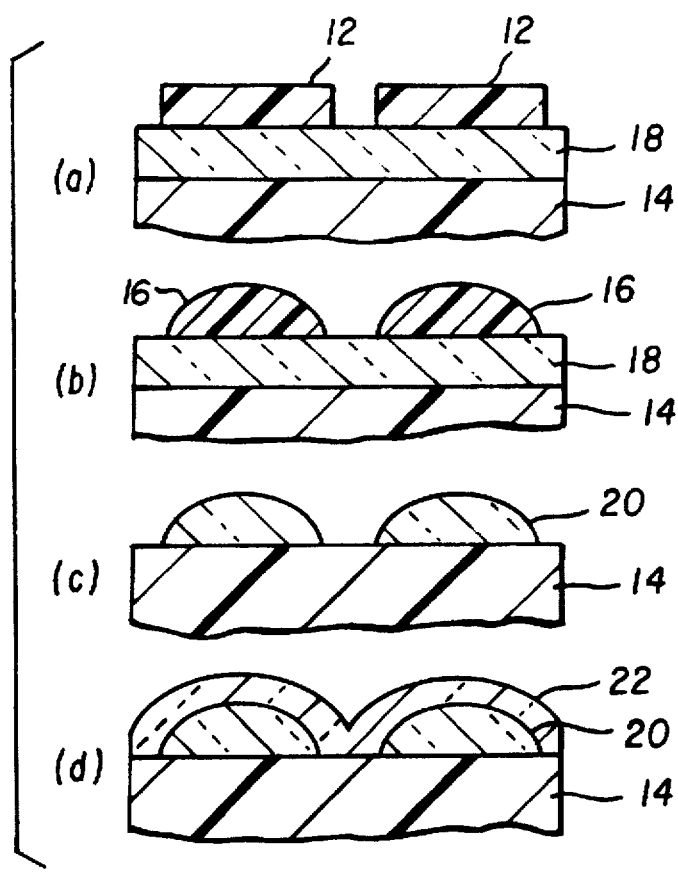
FIG. 4 shows a series of steps (A–D) in another conventional process for forming lenslets.

The improvement in visible light transparency provided by this invention is clearly demonstrated by comparison of FIG. 1 (prior art) with FIG. 2 (this material). The FIGS. show the % transmittance versus wavelength for freshly prepared and for aged lenslet materials. The prior art material displays unacceptable absorbance at shorter wavelengths that gets progressively worse when the material is aged for 45 d at 85° C. (FIG. 6). The material of this example shows no unwanted absorption both initially and after being aged at 85° C. for 90 d.

EXAMPLE 4

The procedure from Example 3 was followed using 18.6 g (0.096 mol) of dimethyl terephthalate, 25.2 g (0.101 mol) of 9,9-bis(4-(2-hydroxyethoxy-phenyl)-fluorene, 3.2 g (0.52 mol) of ethylene glycol, and catalytic amounts of zinc acetate dihydrate and antimony trioxide. 34.2 g of polymer was obtained.

EXAMPLE 5

A similar polyester could be synthesized following the procedure from Example 3, using dimethyl terephthalate, 2,2'-(1-methylethylidene)bis[4,1-phenyleneoxy]bisethanol, and ethylene glycol.

EXAMPLE 6

The procedure from Example 3 was followed using 2.86 g (0.015 mol) of dimethyl terephthalate, 4.85 g (0.011 mol) of 9,9-bis(4-(2-hydroxyethoxy-phenyl)-fluorene, 1.0 g (0.016 mol) of ethylene glycol, and catalytic amounts of zinc acetate dihydrate and antimony trioxide. 6.7 g of polymer was obtained.

EXAMPLE 7

The procedure from Example 3 was followed using 2.7 g (0.014 mol) of dimethyl terephthalate, 2.3 g (0.012 mol) of dimethyl isophthalate, 6.8 g (0.16 mol) of 9,9-bis(4-(2-hydroxyethoxyphenyl)-fluorene, 1.1 g (0.018 mol) of ethylene glycol, and catalytic amounts of zinc acetate dihydrate and antimony trioxide. 10.0 g of polymer was obtained.

EXAMPLE 8

A similar polyester could be synthesized following the procedure from Example 3, using dimethyl 4-t-butylisophthalate, 2,2'-(1-methylethylidene)bis[4,1-(2,6-dichloro)phenyleneoxy]bisethanol, and ethylene glycol.

EXAMPLE 9

The procedure from Example 3 was followed using 6.14 g (0.032 mol) of dimethyl terephthalate, 8.77 g (0.020 mol) of 9,9-bis(4-(2-hydroxyethoxy-phenyl)-fluorene, 1.35 g (0.00040 mol) of 4,4'-bis(2-hydroxyethoxy) diphenylsulfone, 1.0 g (0.016 mol) of ethylene glycol, and catalytic amounts of zinc acetate dihydrate and antimony trioxide. 13.3 g of polymer was obtained.

EXAMPLE 10

The procedure from Example 3 was followed using 2.05 g (0.011 mol) of dimethyl terephthalate, 3.01 g (0.0069 mol) of 9,9-bis(4-(2-hydroxyethoxyphenyl)fluorene, 0.18 g (0.00053 mol) of 4,4'-bis(2-hydroxyethoxy) diphenylsulfone, 0.50 g (0.008 mol) of ethylene glycol, and catalytic amounts of zinc acetate dihydrate and antimony trioxide. 3.8 g of polymer was obtained.

EXAMPLE 11

A similar polyester could be synthesized following the procedure from Example 3, using dimethyl 4,4'-biphenyldicarboxylate, 4,4'-bis(2-hydroxyethoxy)biphenyl, and ethylene glycol.

EXAMPLE 12

The procedure from Example 3 was followed using 10.0 g (0.052 mol) of dimethyl terephthalate, 12.4 g (0.028 mol) of 9,9-bis(4-(2-hydroxyethoxy-phenyl)-fluorene, 4.3 g (0.013 mol) of 4,4'-bis(2-hydroxyethoxy)diphenylsulfone, 1.6 g (0.026 mol) of ethylene glycol, and catalytic amounts of zinc acetate dihydrate and antimony trioxide. 22.7 g of polymer was obtained.

EXAMPLE 13

The procedure from Example 3 was followed using 4.5 g (0.023 mol) of dimethyl terephthalate, 0.50 g (0.0015 mol) of dimethyl 4,4'-sulfonylbisbenzoate, 8.1 g (0.018 mol) of 4,4'-bis(2-hydroxyethoxy)diphenylsulfone, 0.77 g (0.012 mol) of ethylene glycol, and catalytic amounts of zinc acetate dihydrate and antimony trioxide. 11.1 g of polymer was obtained.

EXAMPLE 14

A similar polyester could be synthesized following the procedure from Example 3, using diethyl 4,4'- oxydibenzoate, 1,1-bis[4-(2-hydroxyethoxy)phenyl] cyclohexane, and ethylene glycol.

EXAMPLE 15

The procedure from Example 3 was followed using 49.1 g (0.203 mol) of dimethyl 2,6-dinaphthoate, 41.1 g (0.101 mol) of 2,2'-[(octahydro-4,7-methano-5H-inden-5-ylidene) bis(4,1-phenyleneoxy)]bisethanol, 9.9 g (0.159 mol) of ethylene glycol, and catalytic amounts of zinc acetate dihydrate and antimony trioxide. 78.3 g of polymer was obtained.

EXAMPLE 16

The procedure from Example 3 was followed using 23.1.1 g (0.119 mol) of dimethyl terephthalate, 21.6 g (0.071 mol) of 4,4'-bis(2-hydroxyethoxy)benzophenone, 4.0 g (0.064 mol) of ethylene glycol, and catalytic amounts of zinc acetate dihydrate and antimony trioxide. 23.2 g of polymer was obtained.

EXAMPLE 17

A similar polyester could be synthesized following the procedure from Example 3, using dimethyl 4,4'-thiodibenzoate, 1,1-bis[4-(2-hydroxyethoxy)phenyl] cyclopentane, and ethylene glycol.

EXAMPLE 18

The procedure from Example 3 was followed using 10.0 g (0.051 mol) of dimethyl terephthalate, 13.67 g (0.0335 mol) of 2,2'-[(octahydro-4,7-methano-5H-inden-5-ylidene) bis(4,1-phenyleneoxy)]bisethanol, 1.4 g (0.022 mol) of ethylene glycol, and a catalytic amount of titanium tetraisopropoxide. 18.6 g of polymer was obtained.

EXAMPLE 19

The procedure from Example 3 was followed using 8.0 g (0.041 mol) of dimethyl terephthalate, 10.8 g (0.025 mol) of 1-(2-naphthyl)-1,1-bis[4-(2-hydroxyethoxy)phenyl]ethane, 1.4 g (0.023 mol) of ethylene glycol, and catalytic amounts of zinc acetate dihydrate and antimony trioxide. 15.7 g of polymer was obtained.

EXAMPLE 20

A similar polyester could be synthesized following the procedure from Example 3, using dimethyl 2,5'-furandicarboxylate, 2,2'-[(2,2,2-trifluoro-1-(trifluoromethyl)ethylidene]bis(4,1-phenyleneoxy]-bisethanol, and butylene glycol.

EXAMPLE 21

The procedure from Example 3 was followed using 15.0 g (0.077 mol) of dimethyl terephthalate, 26.5 g (0.062 mol) of 1-(2-naphthyl)-1,1-bis[4-(2-hydroxyethoxy)phenyl] ethane, 1.9 g (0.031 mol) of ethylene glycol, and catalytic amounts of zinc acetate dihydrate and antimony trioxide. 34.3 g of polymer was obtained.

EXAMPLE 22

The procedure from Example 3 was followed using 3.80 g (0.020 mol) of dimethyl terephthalate, 4.03 g (0.012 mol) of 4,4'-bis(2-hydroxyethoxy)-diphenyl-sulfone, 0.77 g (0.012 mol) of ethylene glycol, and catalytic amounts of zinc acetate dihydrate and antimony trioxide. 5.8 g of polymer was obtained.

EXAMPLE 23

A similar polyester could be synthesized following the procedure from Example 3, using dimethyl 2,5'-pyridinedicarboxylate, 2,2'-[(bicyclo[2.2.1]hept-2-ylidenebis(4,1-phenyleneoxy)]bisethanol, and 1,4-cyclohexanedimethanol.

EXAMPLE 24

The procedure from Example 3 was followed using 14.5 g (0.075 mol) of dimethyl terephthalate, 28.4 g (0.045 mol) of 4,4'-isopropylidenebis[2-(2,6-dibromophenoxy)ethanol], 2.7 g (0.43 mol) of ethylene glycol, and catalytic amounts of zinc acetate dihydrate and antimony trioxide. 36.4 g of polymer was obtained.

The invention has been described with reference to a preferred embodiment. However, it will be appreciated that variations and modifications can be effected by a person of ordinary skill in the art without departing from the scope of the invention.

PARTS LIST 12 photosensitive resin lenslet precursor
14 organic planarization/spacer layer
16 photosensitive resin lenslet
18 inorganic transparent lenslet-forming layer
20 inorganic transparent lenslet
22 inorganic lenslet covering film
24 inorganic planarizatioin/spacer layer
26 organic lenslet-forming layer
28 first photosensitive resin layer
30 first photosensitive resin etch-mask
32 organic lenslet precursor
34 organic lenslet
36 second photosensitive resin etch-mask
38 inorganic planarization/spacer pad
40 polyester transparent lenslet-forming layer
42 thin inorganic etch-stop layer
44 thin photosensitive resin mask
46 thin inorganic etch-stop mask
48 polyester transparent lenslet precursor
50 polyester transparent lenslet
52 first thin inorganic etch-stop layer
54 first thin photosensitive resin mask
56 first thin inorganic etch-stop mask
58 polyester transparent lenslet-forming layer
60 second thin inorganic etch-stop layer
62 second thin photosensitive resin mask
64 second thin inorganic etch-stop mask
66 polyester transparent lenslet precursor
68 organic planarization/spacer pad
70 patterned first thin inorganic etch-stop mask
72 polyester transparent lenslet

We claim:

1. A method for forming lenslets which collect light and focus it onto photosensitive elements of an electronic imager, comprising the steps of:

(a) providing a transparent polyester lenslet-forming layer on a substrate or on layer(s) on the substrate, the polyester containing a repeat unit, in part, having the structure

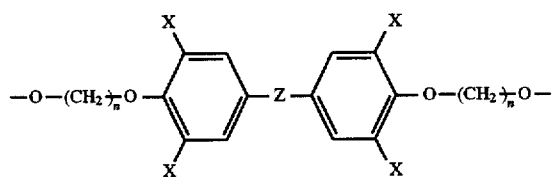

wherein:

n is 2 or greater;

X is selected from the group consisting of H, CH$_3$, Br and Cl; and

Z is selected from the group consisting of nil, O, S, CH$_2$, C=O, SO, SO$_2$, CH—CH$_3$, CH$_3$—C—CH$_3$, CF$_3$—C—CF$_3$, CH$_3$—C—CH$_2$CH$_3$,

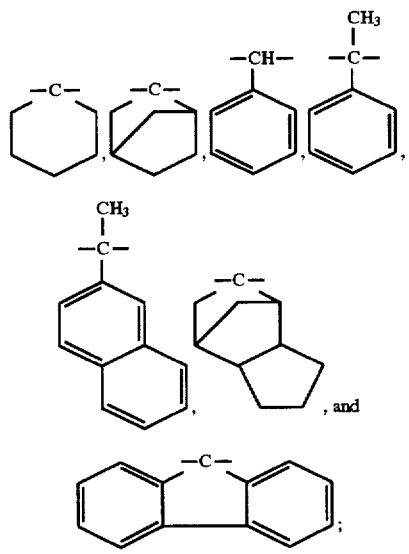

(b) forming a thin etch-stop layer on the transparent lenslet-forming layer and patterning the etch-stop layer to form a mask so that the pattern corresponds to lenslets to be formed;

(c) anisotropically plasma etching the transparent lenslet-forming layer according to the pattern;

(d) removing the thin etch-stop mask; and (e) thermally reflowing the patterned transparent layer to form the transparent lenslets.

2. A method for forming lenslets which collect light and focus it onto photosensitive elements of an electronic imager, comprising the steps of:

(a) providing a transparent polyester lenslet-forming layer on a substrate or on layer(s) on the substrate, the polyester containing a repeat unit, in part, having the structure

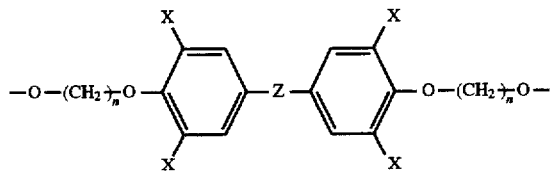

wherein:

n is 2 or greater;

X is selected from the group consisting of H, CH$_3$, Br and Cl; and

Z is selected from the group consisting of nil, O, S, CH2, C=O, SO, SO$_2$, CH—CH$_3$, CH$_3$—C—CH$_3$, CF$_3$—C—CF$_3$, CH$_3$—C—CH$_2$CH$_3$,

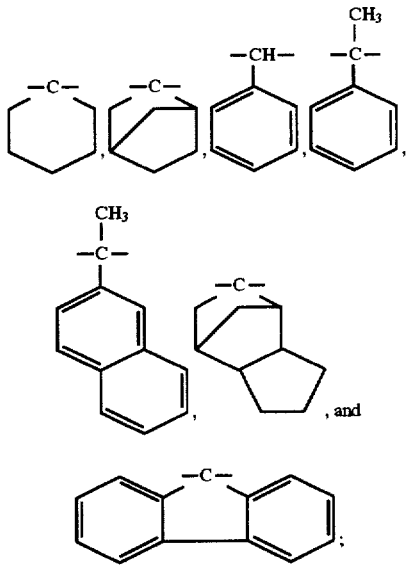

(b) forming a thin etch-stop layer on the transparent lenslet-forming layer and patterning a thin photosensitive resin mask on the etch-stop layer so that the mask pattern corresponds to lenslets to be formed;

(c) transferring by etching the pattern of the photosensitive resin mask to the thin etch-stop layer;

(d) anisotropically plasma etching the transparent lenslet-forming layer according to the thin etch-stop mask pattern;

(e) removing the thin etch-stop mask; and (f) thermally reflowing the patterned transparent layer to form the transparent lenslets.

3. The method of claim 2 wherein the thin etch-stop is a material selected from the group consisting of silicon dioxide, silicon nitride, silicon, germanium, amorphous carbon, titanium, organometallic glasses, and polymers.

4. The method of claim 2 wherein the thin etch-stop layer is deposited by RF sputtering, thermal evaporation, or plasma enhanced chemical vapor deposition, or spin on glass techniques.

5. A method for forming lenslets which collect light and focus it onto photosensitive elements of an electronic imager, comprising the steps of:

(a) providing a first thin etch-stop layer on a planarization/spacer layer formed on a substrate or layer(s) on a substrate and patterning the etch-stop layer to form a mask on the first thin etch-stop layer;

(b) providing a transparent polyester lenslet-forming layer on a substrate or on layer(s) on the planarizatin layer, the polyester containing repeat units, in part, having the structure:

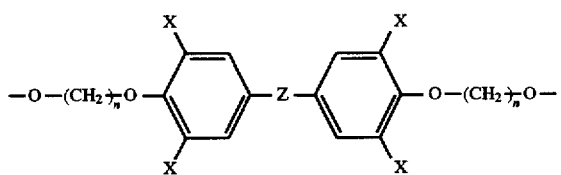

wherein:

n is 2 or greater;

X is selected from the group consisting of H, CH$_3$, Br and Cl; and

Z is selected from the group consisting of nil, O, S, CH2, C=O, SO, SO$_2$, CH—CH$_3$, CH$_3$—C—CH$_3$, CF$_3$—C—CF$_3$, CH$_3$—C—CH$_2$CH$_3$,

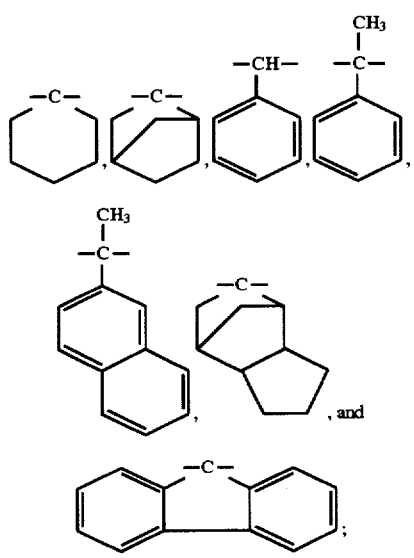

(c) forming a second thin etch-stop layer on the transparent lenslet-forming layer and patterning the second thin layer to form a second mask wherein the second mask pattern corresponds to lenslets to be formed;

(d) anisotropically plasma etching the transparent lenslet-forming layer according to the second thin etch-stop mask pattern;

(e) anisotropically plasma etching the planarization/spacer layer according to the first thin etch-stop mask pattern;

(f) removing the exposed portions of the first thin etch-stop mask and the second thin etch-stop mask; and (g) thermally reflowing the patterned transparent lenslet-forming layer to form the transparent lenslets.

6. A method for forming lenslets which collect light and focus it onto photosensitive elements of an electronic imager, comprising the steps of:

(a) providing a transparent polyester lenslet-forming layer on a substrate or on layer(s) on the substrate, the polyester containing a repeat unit, in part, having the structure

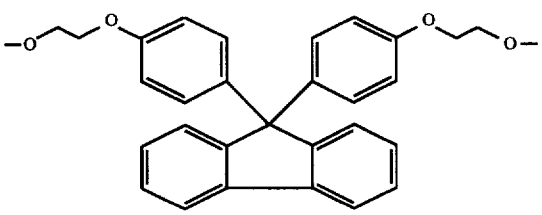

(b) forming a thin etch-stop layer on the transparent lenslet-forming layer and patterning the etch-stop layer to form a mask so that the pattern corresponds to lenslets to be formed;

(c) anisotropically plasma etching the transparent lenslet-forming layer according to the pattern;

(d) removing the thin etch-stop mask; and (e) thermally reflowing the patterned transparent layer to form the transparent lenslets.

7. The method of claim 6 wherein the polyester further includes repeat units containing

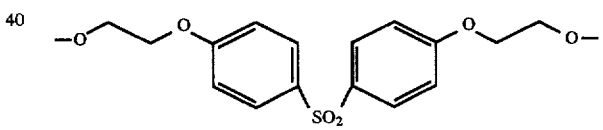

* * * * *